Nov. 29, 1960 R. G. WHITNAH 2,962,674

DIODE RING MODULATION DEVICE

Filed Nov. 26, 1958 2 Sheets-Sheet 1

INVENTOR.
RICHARD G. WHITNAH

BY Edward A. Sokolski

AGENT.

Nov. 29, 1960 R. G. WHITNAH 2,962,674

DIODE RING MODULATION DEVICE

Filed Nov. 26, 1958 2 Sheets-Sheet 2

INVENTOR.
RICHARD G. WHITNAH

BY Edward A. Sokolski

AGENT 2,962,674
Patented Nov. 29, 1960

2,962,674

DIODE RING MODULATION DEVICE

Richard G. Whitnah, Garden Grove, Calif., assignor to North American Aviation, Inc.

Filed Nov. 26, 1958, Ser. No. 776,523

10 Claims. (Cl. 332—43)

Figure 1:
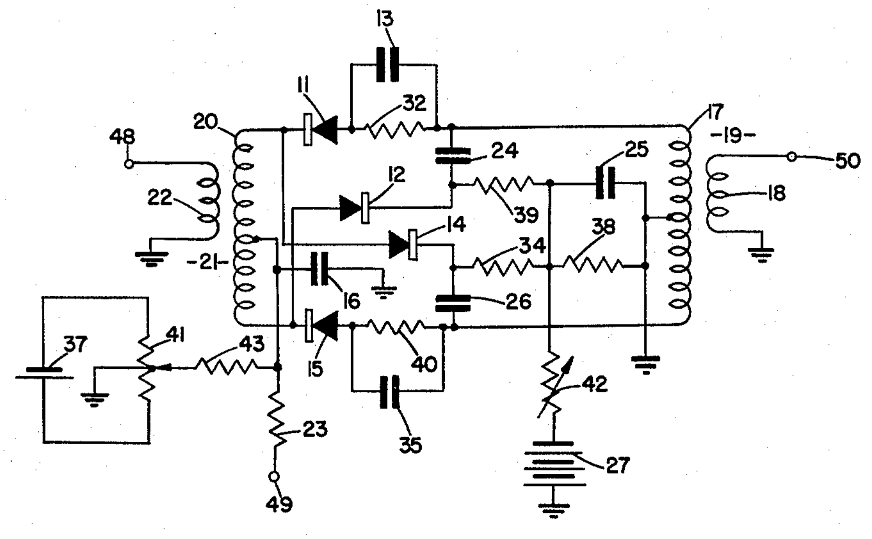

This invention relates to diode ring modulation devices and more particularly to a diode ring modulation device in which the diodes are operated as linear resistance units by proper biasing.

Ring modulation devices which include modulators and demodulators are used quite extensively due to their simplicity of operation and construction. A ring modulator takes a carrier and a modulating voltage input to produce an output composed of two side bands, the carrier being suppressed. As is well known in the art, such a modulation device may be operated as a demodulator by properly feeding in side band signals and a carrier, the modulation signal appearing between appropriate terminals. Therefore, the circuitry to be described herein while described relative to modulation is equally applicable to demodulation. The general operation of nonlinear modulators using ring type circuitry is covered on pages 552 and 553 of the Radio Engineers' Handbook, First Edition, by Frederick E. Terman. Ring modulators of the type described in Terman are especially useful where it is desired that the carrier be effectively eliminated from the output signal. In such a circuit in the absence of any demodulating signal the carrier output will be down approximately 50 db from the carrier input level. In a conventional diode ring modulator, one pair of diodes acts as open switches while the other pair is changing in conductivity in proportion to the carrier and modulating signal levels. There is a drastic change in impedance in the circuit when the diodes switch from the conduction to the nonconduction state and from nonconduction to conduction. This drastic impedance change which is reflected back to the carrier generator results in a distorted output signal.

Very often application demands dictate that the diode modulator be operated with carrier peak voltages of less than 500 millivolts. In such applications, it is necessary to utilize diodes which will conduct when the carrier peak voltage is applied in the proper polarity across their terminals. Germanium diodes will generally satisfy such low level requirements. However, as is well known in the art, germanium diodes have the disadvantage of temperature instability when they are required to operate through extreme temperature ranges. Silicon diodes are now available which will meet extreme temperature range requirements and which will operate at relatively high frequencies. The silicon diode, however, has an inherent contact potential of approximately 500 millivolts which precludes its utilization with carrier input voltages of less than this value. The utilization of silicon diodes has therefore been heretofore impossible in most diode ring modulator circuitry to be used where the carrier levels are under 500 millivolts.

In the device of this invention, a quiescent bias voltage is provided from a single source to all the diodes used in a ring modulator circuit so that these diodes will conduct at all times. A quiescent operating point can be fixed at any desired portion of the diode operating curve. In this manner, the aforementioned problems are effectively eliminated in the device of this invention. Silicon diodes may be utilized in low level modulators enabling such modulators to meet extreme temperature range requirements. In addition, the harmonic distortion in the output signal is minimized throughout the range of applied modulation. This is so because the biased ring modulator presents a nearly constant reflected impedance to the carrier generator, the diodes no longer acting as switches but rather as linear resistance units in push-pull. The harmonic distortion in the output is so negligible that harmonic rejection filters which are generally used to filter the outputs of ring modulators are not required with the device of this invention. It is therefore an object of this invention to improve the performance of diode ring modulators.

It is a further object of this invention to minimize distortion in the output of diode ring modulators.

It is a still further object of this invention to enable the utilization of silicon diodes in a low level ring modulator.

It is another object of this invention to provide a diode ring modulator which can be operated over extreme temperature ranges.

It is still another object of this invention to provide an improved diode ring modulator in which the diodes may be biased from a single bias source to operate linearly.

It is a further object of this invention to provide a simple modulator circuit having low harmonic distortion in its output.

Figure 2:
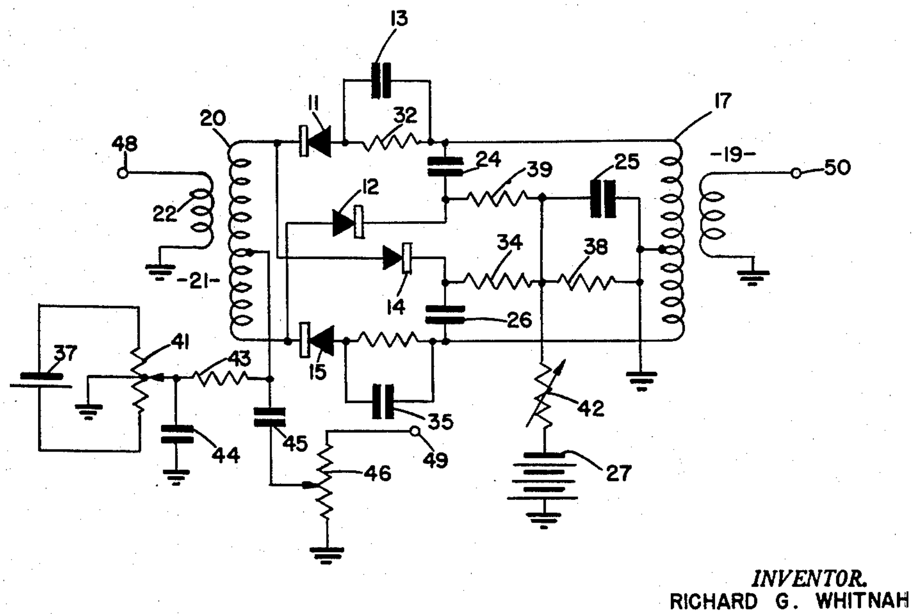
Figure 3:
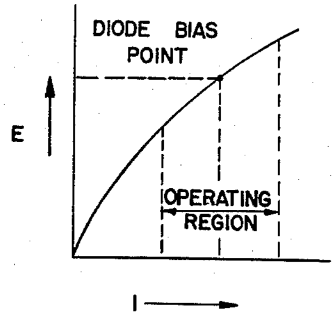
Figure 4:
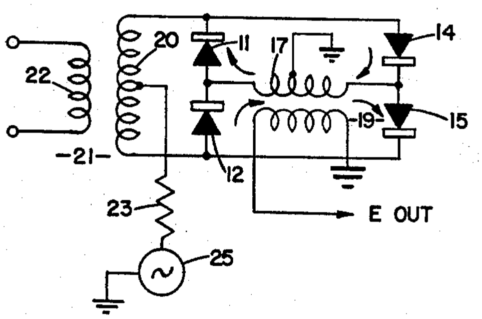
Figure 5:
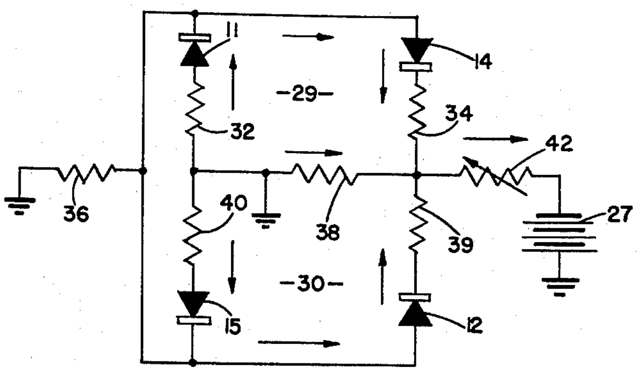

Other objects of this invention will become apparent from the following description taken in connection with the accompanying drawings in which Fig. 1 is a schematic diagram of a first embodiment of the invention, Fig. 2 is a schematic diagram of a second embodiment of the invention, Fig. 3 is a typical current/voltage curve of a diode which may be used in the device of this invention with the effect of the bias voltage illustrated, Fig. 4 is a schematic diagram of the equivalent A.-C. circuit of the device of the invention, and Fig. 5 is a schematic diagram of the equivalent D.-C. circuit of the device of the invention.

Referring to Fig. 4, which is a schematic diagram of the equivalent A.-C. circuit of the device of the invention, the carrier input signal is fed to the input winding 22 of transformer 21. This carrier input may be either radio or audio frequency. The carrier input is inductively coupled to secondary winding 20 of transformer 21. A modulating voltage is fed from modulation source 25 through isolating resistor 23 to the center tap of winding 20. When the voltage at the top end of winding 20 is positive with respect to the voltage at the bottom end of this winding, and there is no modulating voltage input from source 25, the carrier voltage appearing across winding 20 will effect a current flow through diode 14, one-half of winding 17 of transformer 19 to the winding center tap which is the return circuit to ground. An opposite current flow will be effected from the lower portion of winding 20, the conventional current flow, as indicated by the arrows, being from ground through one-half of winding 17 through diode 15 to the bottom end of winding 20. Assuming proper balance in the operation of the diodes which can be assured by appropriate means to be explained later on, the current through the conduction paths of diodes 14 and 15 should be equal and should cancel each other out in winding 17. When the polarity of the voltage across winding 20 is reversed so that the top end of the winding is negative with respect to the bottom end, similar but opposite current flows to that through diodes 14 and 15 will be effected through diodes 11 and 12 respectively and the other half of winding 17 as indicated by the arrows next to these components and these equal and opposite currents in winding 17 will similarly cancel each other out.

Thus, it can be seen with carrier input alone, the effective current flow through winding 17 will be zero and there will be no output voltage across winding 18.

If a modulation voltage is introduced at the center tap of winding 20, this balanced operation is upset and an effective current flow in one direction or the other will occur in winding 17 in accordance with this modulation voltage. Effectively what occurs is that the modulation voltage raises the effective resistance of one diode of each pair of diodes while lowering that of the other diode of each pair. As will be pointed out later on, the diodes are always kept conductive by the quiescent bias voltage provided so that we always have some current flowing even in those diodes which have a comparatively high resistance. Let us assume that the modulating voltage is such that a positive voltage is established at the center tap of winding 20 with respect to ground for a number of cycles of the carrier input. Such a voltage will tend to produce a current through diode 14 which will effectively lower the resistance of this diode. At the same time, this modulation voltage will cause a similar current flow through diode 12 which will lower its resistance. The effective resistances of these diodes will vary in accordance with this applied voltage. At the same time the effective resistances of diodes 11 and 15 will be kept relatively high due to the back biasing effect of such a modulating voltage. The A.-C. carrier will therefore see a relatively low varying resistance path through diodes 14 and 12 and winding 17 to ground, while at the same time it will see a relatively high resistance path through diodes 11 and 15. It can readily be seen that when the modulation voltage goes negative, a low resistance path will be provided through diodes 11 and 15 and a relatively high resistance path through diodes 14 and 12. Accordingly, we have an alternating current through winding 17 which will vary the amplitude of the carrier in accordance with modulation voltage.

This circuitry as explained so far (without diode bias) functions similarly to the operation of a conventional diode ring modulator. However, unlike conventional circuits, in the device of this invention, the diodes do not operate as switches but rather are made to operate linearly. This is accomplished by keeping the diodes conductive at all times by the application of a proper bias voltage.

The operation of the bias voltage means may be explained by reference to Figs. 3 and 5. In Fig. 3 we see a typical E/I (voltage/current) curve for a diode. By conventional design techniques, a satisfactory operating point may be selected on this curve so that a region of operation for the particular modulating voltage input to be utilized will produce a satisfactory linear output. Such an operating region might be selected, for example, as indicated in Fig. 3. As can be seen in this figure, a diode bias point may be selected toward the center of this operating region. If the bias voltage so selected is then applied to all of the diodes utilized in a modulator, linear operation should be achieved.

The basic equivalent biasing circuit utilized in the device of this invention is illustrated in Fig. 5. A D.-C. bias source 27 should be connected so as to provide equal currents through all of the diodes. Basically, this is achieved by utilizing two similar resistance networks. The first of these, 29, includes diodes 11 and 14 and resistors 32 and 34. The second of these paths, 30, includes diodes 12 and 15 and resistors 39 and 40. The amount of bias current can be adjusted by means of variable resistor 42. It is necessary that the resistance of network 30 be kept equal to that of network 29 to assure equal current in both networks and equal bias voltages for all of the diodes, thereby providing for similar operation of all of the diodes and linear operation. Resistance 36 represents the effective D.-C. resistance path between the diodes and ground through the modulator and balancing circuitry. The details of the functioning of the components of the biasing circuitry will be explained with the description of the specific embodiments.

Referring to Fig. 1, a schematic diagram of a first embodiment of the invention is shown. A carrier voltage, which may be in either the audio frequency or radio frequency range, is fed across primary winding 22 of transformer 21 between terminal 48 and ground. This carrier voltage is coupled through the transformer to secondary winding 20. Capacitor 16 is connected between the center tap of winding 20 and ground. This capacitor should be chosen to have negligible impedance at the frequency of the carrier voltage and effectively grounds the center tap as seen by the carrier input. Capacitor 16 on the other hand should offer a relatively high impedance to the modulating voltage. A modulating signal which generally should be one-tenth of the carrier frequency or lower is coupled between terminal 49 and ground. The modulating signal is fed through resistor 23 which effectively isolates the modulator from loading by the modulation source, to the center tap of transformer winding 20. The cathode of diode 11 is connected to the top end of winding 20, the anode of this diode being connected through capacitor 13 and resistor 32 which are paralleled, to the top end of winding 17 of output transformer 19. The anode of diode 14 is connected to the top end of transformer winding 20. The cathode of diode 14 is connected through resistor 34 to one side of variable resistor 42.

Capacitor 26 should provide a low impedance path to the carrier voltage from the cathode of diode 14 to the bottom end of winding 17 but should be chosen so as to present a relatively high impedance to the modulation voltage.

The cathode of diode 15 is connected to the bottom end of winding 20. The anode of diode 15 is connected through resistor 40, which is in parallel with capacitor 35, to the bottom end of winding 17.

Capacitors 35 and 13 should be chosen so as to have a relatively low impedance at the carrier frequency but a relatively high impedance at the modulation frequency.

The anode of diode 12 is connected to the bottom end of winding 20, the cathode of diode 12 being connected through resistor 39 to one end of variable resistor 42 and to resistor 38 paralleled by capacitor 25 to the center tap of of winding 17 which is grounded.

Capacitor 25 should be chosen to have negligible impedance at the carrier frequency.

Bias voltage is supplied by battery 27 and fed through variable resistor 42 to the common connection between resistors 34, 38, and 39. Variable resistors 42 and fixed resistor 38 form a voltage divider network to ground so that the bias voltage applied to the circuit may be readily adjusted by means of variable resistor 42. Capacitor 24 provides a low impedance path for the carrier signal between the cathode of diode 12 and the top end of winding 17, but this capacitor should be chosen at the same time to offer a high impedance at the modulation signal frequencies. The output signal is available between terminal 50 and ground across winding 18 of output transformer 19.

Balanced operation of the circuit is aided by the circuitry comprising direct current power source 37, potentiometer 41, and resistor 43. Power source 37 is connected between the ends of potentiometer 41. The center tap of the potentiometer is grounded while its arm is free to move between the center tap and either end. The arm of the potentiometer is connected through resistor 43 to the center tap of transformer winding 20. Potentiometer 41 may be adjusted to provide a bias to the diodes which will equalize conduction on alternate half cycles of the carrier when there is no modulation input.

Resistor 43 should be chosen so that the balance circuitry does not unnecessarily load either the modulator or the modulation input. With no modulation input, potentiometer 41 should be adjusted until there is substantially zero output between terminal 50 and ground with normal carrier input between terminal 48 and ground. This indicates balanced operation of the circuitry and assures maximum rejection of the carrier signal in the output.

As was explained in the description of the effective D.-C. circuit, it is desirable that the D.-C. paths through all of the diodes be kept equal. This may be readily accomplished by using diodes with similar conduction characteristics and choosing resistors 34, 32, 39, and 40 so that the sum of the resistance of resistors 34 and 32 is equal to the sum of the resistance of resistors 39 and 40.

Resistor 23 should be chosen so that it adequately isolates the modulation circuitry from loading by the modulation source. Such isolation will generally be adequate if the resistance of resistor 23 is ten times greater than that of the symmetrical D.-C. current paths.

Resistors 34 and 39 are used to effectively isolate the two diode legs from each other, at the same time providing a current feed path from bias source 27. Capacitors 13, 35, 24, and 26 provide low impedance paths for the modulated carrier signal from the diodes to the output transformer, at the same time effectively blocking the passage of the modulating signal and the D.-C. bias current. Capacitor 25 is a by-pass capacitor for the carrier and modulated carrier signals.

The general operation of the circuit is as described for the equivalent circuit diagrams of Fig. 4 and Fig. 5. The diode bias may be adjusted by means of variable resistor 42 to cause a current flow of from about 40–70 microamperes through each diode of silicon diodes are used. Such a current through silicon diodes will produce about .6 volt across each diode. For germanium diodes the diode current should be adjusted to about 50 microamperes which will produce about .12 volt across each diode. The circuit of Fig. 1 will operate quite satisfactorily with carrier signals of up to 30 megacycles and with low frequency modulation signals. Typical component values for operation at 30-megacycle carrier frequencies and very low frequency modulation inputs might be as follows:

| | | |
|---|---|---|
| Resistors **32, 39, 40,** and **26** | kilohms | 3.9 |
| Capacitors **13, 35, 24,** and **26** | mmfd | 470 |
| Diodes **11, 12, 14,** and **15** | | Type 1N251 |
| Capacitors **16** and **25** | mfd | .005 |
| Resistor **38** | kilohms | 1 |
| Resistor **23** | do | 51 |
| Variable resistor **42** | do | 91 |
| Resistor **43** | do | 270 |
| Potentiometer **41** | do | 100 |
| Power source **37** | volts | 2 |
| Power source **27** | do | 150 |

Referring now to Fig. 2, a second embodiment of the invention is shown. This second embodiment functions similarly to the first. However, it is adapted to operate with high frequency modulation signals, such as, for example, sharp pulses of about 1 microsecond duration. Such modification for high frequency modulation inputs is achieved by changing the input circuitry so that it will not by-pass or attenuate high frequency modulation signals. The modulation input is fed between terminal 49 and ground across potentiometer 46 which is utilized to adjust the level of the input modulation signal. The modulation signal is coupled through coupling capacitor 45 to the center tap of winding 20. A ground return path for the carrier frequency signals is provided from the center tap of winding 20 through capacitor 45 and part of potentiometer 46 to ground. A direct by-pass to ground from the center tap of winding 20 is eliminated so as to minimize attenuation to the high frequency modulation signal. A bias potentiometer 41 similar to that of Fig. 1 is utilized. However, the arm of potentiometer 41 is by-passed by capacitor 44 to ground so as to keep the high frequency modulation signals out of the balance adjustment circuitry. Otherwise the circuitry of Fig. 2 is identical with that of Fig. 1. The values of the capacitors utilized may be chosen to provide proper low impedance and high impedance paths to the carrier and modulation signals as desired based on the criteria already set forth for each component. The circuit of Fig. 2 will operate satisfactorily with carrier inputs of up to 30 megacycles and with high frequency modulation inputs of up to 3 megacycles.

The circuits of Figs. 1 and 2 in actual tests have operated successfully with distortion of under 5 percent and with modulation voltages of from zero to 3 megacycles with carrier signals of up to 30 megacycles. The carrier and modulation frequencies could be increased and are limited only by the characteristics of the diodes utilized. Of course per usual design criteria, the modulation frequency should be kept to one-tenth of the carrier frequency or lower.

The device of this invention thus provides a ring modulator which has diodes operated with a forward bias from a single bias source and which is thereby enabled to operate with very low distortion output.

While this invention has been described and illustrated in detail, it is to be clearly understood that the same is by way of illustration and example only and is not to be taken by way of limitation, the spirit and scope of this invention being limited only by the terms of the appended claims.

I claim:

1. In combination, a diode ring modulation device having a plurality of ring connected diodes, a source of bias potential, and a resistance network connected in circuit with said diodes and said source of establishing equal forward bias for all of said diodes.

2. In a diode ring modulation device, a bias source, means for providing first and second current paths of equal resistance across said source, each said path having a pair of series connected diodes and a pair of resistors respectively connected between one side of each diode of said diode pairs and one side of said source, said diodes being forward biased to conduction.

3. A diode ring modulation device comprising two pairs of ring connected diodes, input circuit means for coupling input signal sources to said diodes, output circuit means for coupling the signal current flow through said diodes to a load, and single bias means for providing equal forward biasing to each of said diodes comprising a resistive network and a source of direct current coupled through said resistive network to said diodes, said resistive network being connected to provide equal bias currents through all of said diodes.

4. In a diode ring modulation device, means for equally forward biasing each of the diodes of said modulation device comprising a single D.-C. bias source and means for adjusting the voltage output of said bias source, said diodes being connected in circuit with said bias source output, the resistances of the current paths from said bias source through said diodes being substantially equal to each other, whereby said diodes are enabled to operate linearly at a predetermined operating point.

5. In a diode ring modulation device, means for equally forward biasing each of the diodes of said modulation device comprising a single D.-C. bias source, means for adjusting the voltage output of said bias source, said diodes being connected in circuit with said bias source output, the resistances of the current paths from said bias source through said diodes being substantially equal to each other, and means for by-passing carrier signals around the resistive elements of said bias source current paths, whereby said diodes are enabled to operate linearly at a predetermined operating point.

6. The device as recited in claim 5 wherein said means for by-passing carrier signals comprises capacitors.

7. In a diode ring modulation device, two pairs of oppositely poled diodes, input circuit means for operatively connecting input signals to said diodes, output circuit means for coupling the signal current flow through said diodes to a load, means for equally forward biasing each of said diodes comprising a single D.-C. bias source and means for adjusting the voltage output of said bias source, said diodes being connected in circuit with said bias source output, the resistances of the current paths from said bias source through said diodes being substantially equal to each other, and means for by-passing carrier signals around the resistive elements of said bias source current paths, whereby said diodes are enabled to operate linearly about a predetermined operating point.

8. In a diode ring modulation device, an input transformer having a primary winding for receiving carrier input signals and a center tapped secondary winding, an output transformer having a center tapped primary winding, a first diode, one side of said first diode being connected to one end of said center tapped secondary, a first capacitor and a first resistor connected in parallel, said first resistor and capacitor being connected between the other side of said first diode and one end of said tapped primary winding, a second diode, a second resistor and a second capacitor connected in parallel, said second diode, second capacitor and second resistor being connected in circuit between the other ends of said center tapped secondary and said center tapped primary like said first diode, first resistor, and first capacitor are connected between said one end of said tapped primary and secondary, a direct current bias source, a third resistor, a third diode connected between said one end of said tapped secondary and one end of said third resistor, the other end of said third resistor being connected to said bias source, a third capacitor connected between said one end of said third resistor and the other end of said tapped primary, a fourth diode, a fourth resistor, said fourth diode being connected between the other end of said tapped secondary and one end of said fourth resistor, the other end of said fourth resistor being connected to said bias source, a fourth capacitor connected between said one end of said tapped primary and said one end of said fourth resistor, a modulation voltage terminal connected in circuit with the center tap of said tapped secondary winding, and direct current balance means connected to the center tap of said tapped secondary.

9. The device as recited in claim 8 wherein said direct current balance means comprises a direct current source, and means for adjusting the output of said source to positive and negative voltages with respect to ground.

10. In combination, four diodes connected in a bridge circuit, four capacitive elements each connected in series with a respective diode in an arm of said bridge, a first direct current resistive path including two of said diodes, and a second direct current resistive path including the remaining two of said diodes, a D.-C. source connected in said paths for biasing said diodes to conduct.

References Cited in the file of this patent

UNITED STATES PATENTS

| | | |
|---|---|---|
| 2,820,949 | Hey | Jan. 21, 1958 |
| 2,870,346 | Essler | Jan. 20, 1959 |

FOREIGN PATENTS

| | | |
|---|---|---|
| 630,088 | Great Britain | Oct. 5, 1949 |